United States Patent
Tomura et al.

(10) Patent No.: US 10,600,654 B2
(45) Date of Patent: Mar. 24, 2020

(54) ETCHING PROCESS METHOD

(71) Applicant: Tokyo Electron Limited, Tokyo (JP)

(72) Inventors: Maju Tomura, Miyagi (JP); Jin Kudo, Miyagi (JP); Yoshinobu Ohya, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 4 days.

(21) Appl. No.: 15/618,557

(22) Filed: Jun. 9, 2017

(65) Prior Publication Data

US 2017/0358460 A1 Dec. 14, 2017

(30) Foreign Application Priority Data

Jun. 10, 2016 (JP) .................. 2016-116493

(51) Int. Cl.
*H01L 21/311* (2006.01)
*H01L 21/67* (2006.01)
(Continued)

(52) U.S. Cl.
CPC .. *H01L 21/31116* (2013.01); *H01J 37/32091* (2013.01); *H01J 37/32165* (2013.01); *H01J 37/32449* (2013.01); *H01J 37/32642* (2013.01); *H01J 37/32724* (2013.01); *H01L 21/31144* (2013.01); *H01L 21/67069* (2013.01); *H01L 21/67109* (2013.01); *H01L 21/67248* (2013.01); *H01L 21/6831* (2013.01); *H01J 2237/334* (2013.01); *H01L 27/11551* (2013.01);
(Continued)

(58) Field of Classification Search
CPC ......... H01L 21/31116; H01L 21/31144; H01L 21/67069; H01L 27/11578; H01L 27/11551; H01J 37/32724; H01J 37/32449; H01J 2237/334
See application file for complete search history.

(56) References Cited

U.S. PATENT DOCUMENTS

2012/0214310 A1* 8/2012 Sheu ................. H01L 21/31116
                                                          438/702
2012/0231630 A1* 9/2012 Takada ................ H01L 21/3065
                                                          438/706

FOREIGN PATENT DOCUMENTS

JP   2010-500758   1/2010
JP   2012-238891   12/2012
(Continued)

OTHER PUBLICATIONS

S. Wolf and R.N. Tauber, (Silicon Processing for the VLSI Era, vol. 1—Process Technology, Lattice Press, 1986)(pp. 542-557).*

*Primary Examiner* — Nadine G Norton
*Assistant Examiner* — Mahmoud Dahimene
(74) *Attorney, Agent, or Firm* — IPUSA, PLLC

(57) ABSTRACT

An etching process method is provided that includes outputting a first high frequency power of a first frequency from a first high frequency power supply, and outputting a second high frequency power of a second frequency, which is lower than the first high frequency, from a second high frequency power supply in an cryogenic temperature environment where a substrate temperature is controlled to be less than or equal to −35° C.; generating a plasma by adding a hydrocarbon gas containing at least 3 carbon atoms to an etching gas containing carbon, hydrogen, and fluorine; and etching a silicon oxide film or a laminated film made up of laminated layers of silicon-containing films having different compositions using the generated plasma.

7 Claims, 7 Drawing Sheets

(51) Int. Cl.
    *H01J 37/32*     (2006.01)
    *H01L 21/683*     (2006.01)
    *H01L 27/11556*     (2017.01)
    *H01L 27/11582*     (2017.01)
    *H01L 27/11551*     (2017.01)
    *H01L 27/11578*     (2017.01)

(52) U.S. Cl.
    CPC ... *H01L 27/11556* (2013.01); *H01L 27/11578* (2013.01); *H01L 27/11582* (2013.01)

(56) References Cited

FOREIGN PATENT DOCUMENTS

WO     2008/021609     2/2008
WO     WO-2015194178 A1 *   12/2015   ....... H01L 21/30655

* cited by examiner

US 10,600,654 B2

ETCHING PROCESS METHOD

CROSS-REFERENCE TO RELATED APPLICATION

The present application is based on and claims the benefit of priority to Japanese Patent Application No. 2016-116493 filed on Jun. 10, 2016, the entire contents of which are hereby incorporated by reference.

BACKGROUND OF THE INVENTION

1. Field of the Invention

The present invention relates to an etching process method.

2. Description of the Related Art

Techniques are known for etching a silicon-containing film using a halogen-based gas (see e.g., Published Japanese Translation of PCT International Application No. 2010-500758). On the other hand, by using a hydrocarbon-based (CH-based) gas, such as $CH_4$ (methane) gas or $CH_2F_2$ (difluoromethane) gas, to etch a silicon-containing film, mask selectivity can be increased. For this reason, it is beneficial to use a hydrocarbon-based gas in etching a deep hole or a deep trench having a high aspect ratio, for example.

However, because a hydrocarbon-based gas is a depositing gas, when the amount of hydrocarbon-based gas used is increased, particles may adhere to an opening in a mask and clog the opening to thereby make etching difficult, for example. Also, the surface of the mask may roughen, and the etching profile of a hole formed in the silicon-containing film may be degraded, for example.

SUMMARY OF THE INVENTION

An aspect of the present invention is directed to providing a technique for achieving desired mask selectivity while preventing an opening in a mask from being clogged when performing an etching process on a silicon-containing film.

According to one embodiment of the present invention, an etching process method is provided that includes outputting a first high frequency power of a first frequency from a first high frequency power supply, and outputting a second high frequency power of a second frequency, which is lower than the first high frequency, from a second high frequency power supply in an cryogenic temperature environment where a substrate temperature is controlled to be less than or equal to −35° C.; generating a plasma by adding a hydrocarbon gas containing at least 3 carbon atoms to an etching gas containing carbon, hydrogen, and fluorine; and etching a silicon oxide film or a laminated film made up of laminated layers of silicon-containing films having different compositions using the generated plasma.

DESCRIPTION OF THE PREFERRED EMBODIMENTS

Figure 1:
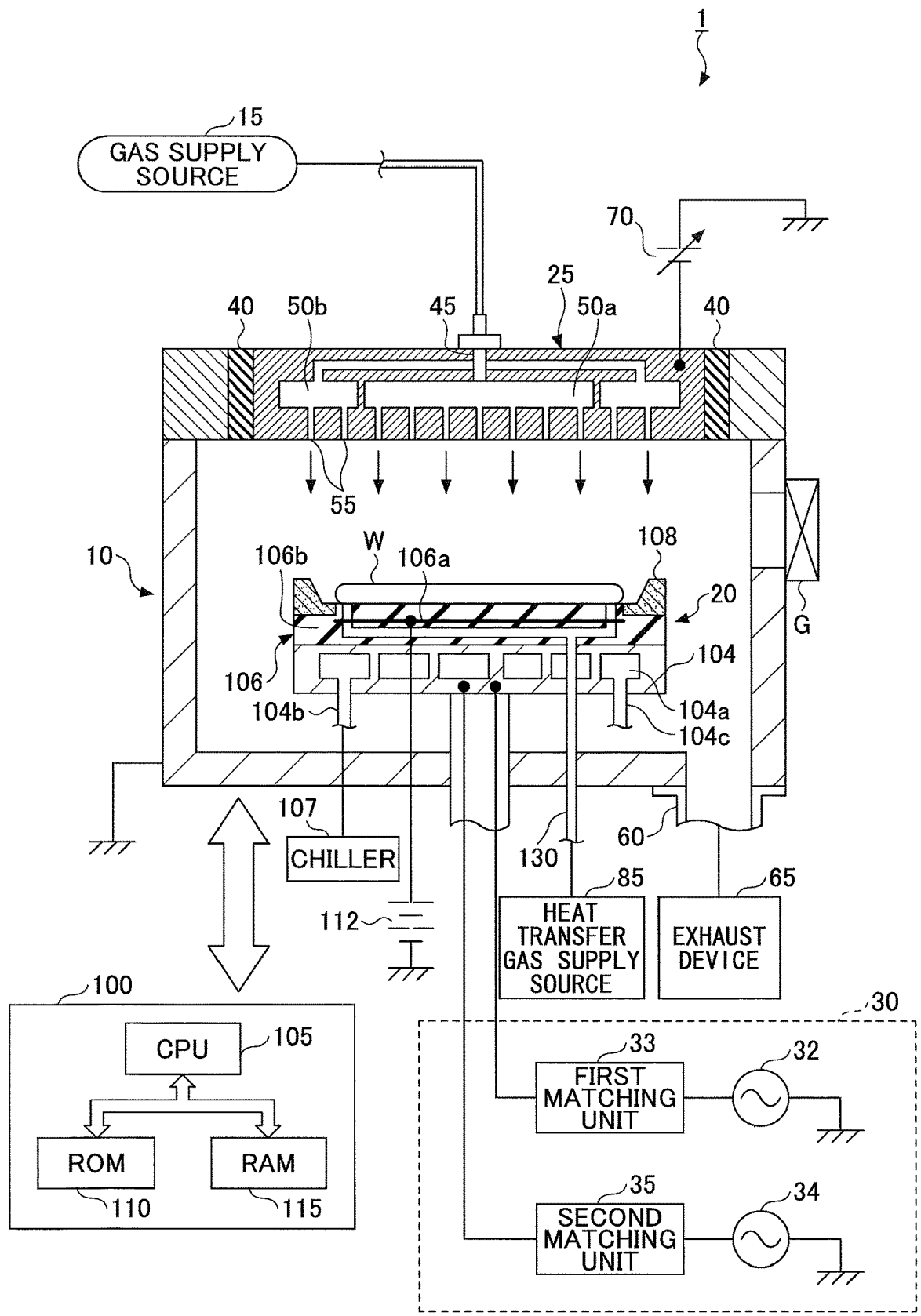
FIG. 1 is a longitudinal cross-sectional view of a plasma processing apparatus according to an example embodiment of the present invention.

In the following, embodiments of the present invention will be described with reference to the accompanying drawings. Note that in the following descriptions and the accompanying drawings, features and elements that are substantially identical are given the same reference numerals and overlapping descriptions thereof may be omitted.

[Overall Configuration of Plasma Processing Apparatus]

In the following, a plasma processing apparatus 1 according to an embodiment of the present invention will be described with reference to FIG. 1. The plasma processing apparatus 1 according to the present embodiment is a capacitively coupled parallel plate plasma processing apparatus that includes a substantially cylindrical processing chamber 10. The inner surface of the processing chamber 10 is subjected to an alumite treatment (anodizing treatment). A plasma process, such as an etching process or a film forming process using plasma, is performed inside the processing chamber 10.

A mounting table 20 for holding a wafer W, as an example of a substrate to be processed, is arranged inside the processing chamber 10. The mounting table 20 may be made of aluminum (Al), titanium (Ti), or silicon carbide (SiC), for example. Note that the mounting table 20 also functions as a lower electrode.

The mounting table 20 includes an electrostatic chuck 106 for electrostatically attracting the wafer W arranged at an upper side of the mounting table 20. The electrostatic chuck 106 includes a chuck electrode 106*a* that is interposed between insulators 106*b*. A direct current (DC) voltage source 112 is connected to the chuck electrode 106*a*. When a DC voltage is applied from the DC voltage source 112 to the chuck electrode 106*a*, the wafer W is electrostatically attracted to the electrostatic chuck 106 by a Coulomb force.

An annular focus ring 108 is arranged around an outer peripheral portion of the electrostatic chuck 106 to surround the outer edge of the wafer W. The focus ring 108 may be made of silicon, for example. The focus ring 108 converges plasma toward the surface of the wafer W in the processing chamber 10 to thereby improve efficiency of the plasma process performed in the processing chamber 10.

A support 104 is arranged at the lower side of the mounting table 20, and in this way, the mounting table 20 is held at the bottom of the processing chamber 10. A refrigerant flow path 104*a* is formed inside the support 104. A cooling medium (hereinafter also referred to as "refrigerant"), such as cooling water or brine, that is output from a chiller 107 flows and circulates through a refrigerant inlet pipe 104*b*, the refrigerant flow path 104*a*, and a refrigerant outlet pipe 104*c*. By circulating the refrigerant in the above-described manner, heat may be removed from the mounting table 20 so that the mounting table 20 may be cooled.

The plasma processing apparatus 1 also includes a heat transfer gas supply source 85 that supplies heat transfer gas, such as helium (He) gas or argon (Ar) gas, through a gas supply line 130 to a rear face of the wafer W that is arranged on the electrostatic chuck 106. With such a configuration, the temperature of the electrostatic chuck 106 may be controlled by the refrigerant circulated through the refrigerant flow path 104a and the heat transfer gas supplied to the rear face of the wafer W. In this way, the temperature of the wafer W can be controlled to a predetermined temperature.

Also, a power supply device 30 that supplies dual frequency superimposed power is connected to the mounting table 20. The power supply device 30 includes a first high frequency power supply 32 for supplying plasma generating high frequency power HF (first high frequency power HF) of a first frequency for plasma generation. Further, the power supply device 30 includes a second high frequency power supply 34 for supplying a bias voltage generating high frequency power LF (second high frequency power LF) of a second frequency, which is lower than the first frequency. The first high frequency power supply 32 is electrically connected to the mounting table 20 via a first matching unit 33. The second high frequency power supply 34 is electrically connected to the mounting table 20 via a second matching unit 35. The first high frequency power supply 32 applies the plasma generating high frequency power HF of 40 MHz (as the first frequency), for example, to the mounting table 20. The second high-frequency power supply 34 applies the bias voltage generating high frequency power LF of 13.56 MHz (as the second frequency), for example, to the mounting table 20. Note that although the first high frequency power HF is applied to the mounting table 20 in the present embodiment, in other embodiments, the first high frequency power HF may be applied to a gas shower head 25 (described below), for example.

The first matching unit 33 matches the load impedance with the internal (or output) impedance of the first high frequency power supply 32. The second matching unit 35 matches the load impedance with the internal (or output) impedance of the second high frequency power supply 34. The first matching unit 33 functions so that the internal impedance of the first high frequency power supply 32 apparently matches the load impedance when plasma is generated in the processing chamber 10. The second matching unit 35 functions so that the internal impedance of the second high frequency power supply 34 apparently matches the load impedance when plasma is generated in the processing chamber 10.

The gas shower head 25 is arranged at a ceiling portion of the processing chamber 10 to close an opening in the processing chamber 10 via a shield ring 40 that covers the outer edge of the gas shower head 25. A variable DC power supply 70 is connected to the gas shower head 25, and a negative DC (DC voltage) is output from the variable DC power supply 70. The gas shower head 25 may be made of silicon, for example. Note that the gas shower head 25 also functions as a counter electrode (upper electrode) facing the mounting table 20 (lower electrode).

A gas introduction port 45 for introducing gas into the processing chamber 10 is formed in the gas shower head 25. Also, a center-side diffusion chamber 50a and an edge-side diffusion chamber 50b branching from the gas introduction port 45 are formed inside the gas shower head 25. A processing gas output from a gas supply source 15 is supplied to the diffusion chambers 50a and 50b via the gas introduction port 45 to be diffused in the diffusion chambers 50a and 50b after which the processing gas is introduced into the processing chamber 10 toward the mounting table 20 through multiple gas supply holes 55 that are formed in the gas shower head 25.

An exhaust port 60 is formed on a bottom surface of the processing chamber 10, and an exhaust device 65 is connected to the exhaust port 60 so that gas inside the processing chamber 10 may be evacuated. In this way, the interior of the processing chamber 10 can be maintained at a predetermined degree of vacuum. A gate valve G is arranged on a side wall of the processing chamber 10. The gate valve G opens and closes when loading/unloading the wafer W into/out of the processing chamber 10.

The plasma processing apparatus 1 also includes a control unit 100 for controlling overall operations of the plasma processing apparatus 1. The control unit 100 includes a CPU (Central Processing Unit) 105, a ROM (Read Only Memory) 110, and a RAM (Random Access Memory) 115. The CPU 105 executes a desired process, such as an etching process, according to a recipe stored in a storage area of the RAM 115, for example. The recipe specifies control information for the plasma processing apparatus 1 to execute the desired process including predetermined process conditions, such as process time, pressure (gas exhaust), high frequency power and voltage, flow rates of various gases, internal temperature of the processing chamber (upper electrode temperature, side wall temperature, wafer W temperature, electrostatic chuck temperature, etc.), and refrigerant temperature of the refrigerant output from the chiller 107, for example. Note that such recipe describing process conditions and/or other programs may be stored in a hard disk or a semiconductor memory, for example. The recipe may also be stored in a portable computer-readable storage medium, such as a CD-ROM or a DVD, and may be read out by setting the storage medium in the plasma processing apparatus 1 at a predetermined position, for example.

When a plasma process is executed, the gate valve G is controlled to open/close, the wafer W is carried into the processing chamber 10 and placed on the mounting table 20. When a DC voltage is applied from the DC voltage source 112 to the chuck electrode 106a, the wafer W is electrostatically attracted to the electrostatic chuck 106 and held by the electrostatic chuck 106.

A processing gas from the gas supply source 15 is supplied to the processing chamber 10.

The first high frequency power from the first high frequency power supply 32 is applied to the mounting table 20 and the second high frequency power from the second high frequency power supply 34 is applied to the mounting table 20. A negative DC (DC voltage) from the variable DC power supply 70 is applied to the gas shower head 25. In this way, a plasma is generated above the wafer W, and a plasma process is performed on the wafer W by the action of the generated plasma.

After the plasma process, a DC voltage with a polarity that is opposite the polarity of the DC voltage applied to the wafer W upon electrostatically attracting the wafer W to the electrostatic chuck 106 is applied from the DC voltage source 112 to the chuck electrode 106a such that the electric charge of the wafer W is eliminated. In this way, the wafer W is removed from the electrostatic chuck 106 and carried out of the processing chamber 10 via the gate valve G. The plasma processing apparatus 1 according to the present embodiment having the configuration as described above can be used to perform an etching process at a cryogenic temperature using a predetermined etching gas supplied from the gas supply source 15.

[Etching at Cryogenic Temperature: Comparative Example 1]

Figure 2:
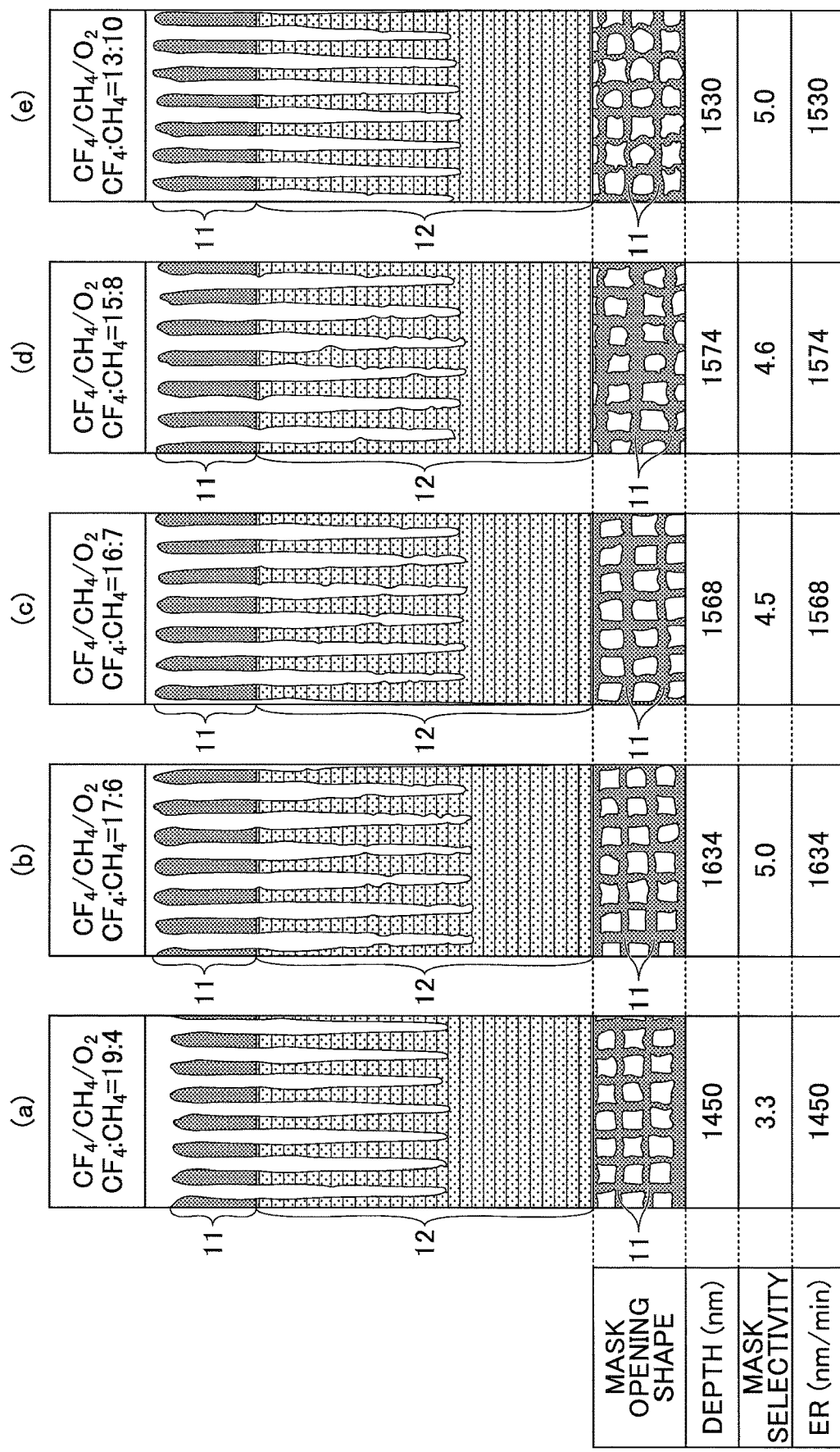
FIG. 2 is a diagram showing example results of etching a silicon-containing laminated film with gas according to Comparative Example 1.

In the following, before describing an etching process according to an embodiment of the present invention, example results of executing an etching process according to a comparative example will be described. FIG. 2 shows example results of executing an etching process according to Comparative Example 1 in which a gas containing methane ($CH_4$) gas and carbon tetrafluoride ($CF_4$) gas is used as an etching gas.

In Comparative Example 1, an etching process is performed under the following process conditions on a laminated film 12 including laminated layers of silicon oxide ($SiO_2$) and silicon nitride (SiN). The laminated film 12 is an example of a silicon-containing film. The process conditions of Comparative Example 1 are indicated in the table below. Also, note that an organic film 11 that is used as a mask is formed on the laminated film 12.

Process Conditions

| Wafer Temperature | −40° C. or lower |
|---|---|
| Gas | $CF_4/CH_4/O_2$ |
| First High Frequency Power HF | 2500 W, continuous wave |
| Second High Frequency Power LF | 6000 W, continuous wave |

In FIG. 2, (a) to (e) represent etching results obtained by controlling the partial pressure ratio (flow rate ratio) of $CF_4$ and $CH_4$ to change while maintaining the total flow rate of $CF_4$ and $CH_4$ to be constant (unchanged). In (a) of FIG. 2, the partial pressure ratio of $CF_4$ to $CH_4$ was controlled to be 19:4, and in (b) of FIG. 2, the partial pressure ratio of $CF_4$ to $CH_4$ was controlled to be 17:6. In (c) of FIG. 2, the partial pressure ratio of $CF_4$ to $CH_4$ was controlled to be 16:7, and in (d) of FIG. 2, the partial pressure ratio of $CF_4$ to $CH_4$ was controlled to be 15:8. In (e) of FIG. 2, the partial pressure ratio of $CF_4$ to $CH_4$ was controlled to be 13:10. That is, the partial pressure of $CH_4$ with respect to $CF_4$ was gradually controlled to increase from (a) to (e) of FIG. 2. Note that the flow rate of $O_2$ gas was controlled to be constant. The $O_2$ gas was included in the etching gas in order to prevent carbon contained in the $CF_4$ and $CH_4$ gases from increasing to thereby clog openings in the mask.

In FIG. 2, (a) to (e) show longitudinal cross-sectional etching profiles of holes formed in the laminated film 12 as a result of etching the laminated film 12 using the organic film 11 as a mask and top views of the openings of the holes in the organic film 11. Also, in (a) to (e) of FIG. 2, numeric values representing the etching depth (nm), the mask selectivity, and the etch rate (ER) (nm/min) are indicated.

As can be appreciated from the etching results of FIG. 2, when the partial pressure of $CH_4$ with respect to $CF_4$ is increased, a remainder of the organic film 11 increases and the mask selectivity increases while the etching depth and the etch rate (ER) are maintained. However, the surface of the organic film 11 roughens and the shapes of the openings in the organic film 11 deteriorate. Note that when the surface of the organic film 11 roughens, it becomes more difficult to transfer the original mask pattern to the laminated film 12.

[Etching at Cryogenic Temperature: Comparative Example 2]

Figure 3:
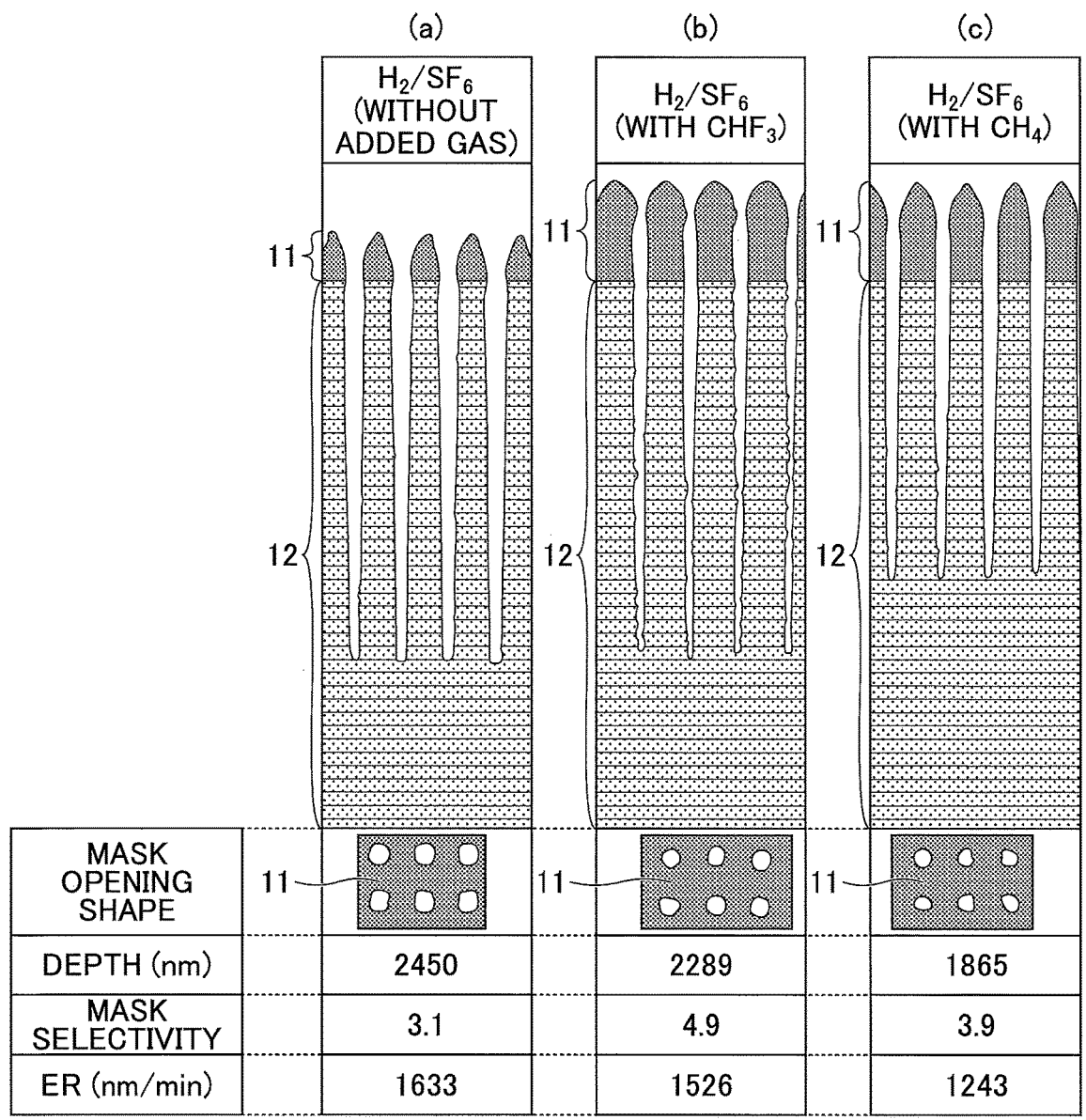
FIG. 3 is a diagram showing example results of etching a silicon-containing laminated film with gas according to Comparative Example 2.

In an etching process according to Comparative Example 2, the laminated film 12 is etched under the following process conditions. The process conditions of Comparative Example 2 are indicated in the table below. FIG. 3 is a diagram showing example results of executing the etching process according to Comparative Example 2 in which a gas containing sulfur hexafluoride ($SF_6$) gas and hydrogen ($H_2$) gas is used as an etching gas.

Process Conditions

| Wafer Temperature | −40° C. or lower |
|---|---|
| Gas | $SF_6/H_2$ (with/without $CH_xF_y$-based gas) |
| First High Frequency Power HF | 2500 W, continuous wave |
| Second High Frequency Power LF | 4000 W, continuous wave |

In FIG. 3, (a) represents an etching result in a case where no $CH_xF_y$-based gas was added to the $SF_6/H_2$ gas, (b) represents an etching result in the case where $CHF_3$ gas was added to the $SF_6/H_2$ gas, and (c) represents an etching result in a case where $CH_4$ gas was added to the $SF_6/H_2$ gas.

As can be appreciated from the etching results (a) to (c) of FIG. 3, when $CHF_3$ gas is added to the $SF_6/H_2$ gas as shown in FIG. 3 (b) and when $CH_4$ gas is added to the $SF_6/H_2$ gas as shown in FIG. 3 (c), the remainder of the organic film 11 increases and the mask selectivity increases as compared with the case where only the $SF_6/H_2$ gas is supplied as shown in FIG. 3 (a). Also, the roughening of the surface of the organic film 11 can be suppressed, but the openings in the organic film 11 become more susceptible to clogging.

[Etching at Cryogenic Temperature: First Embodiment]

Figure 4:
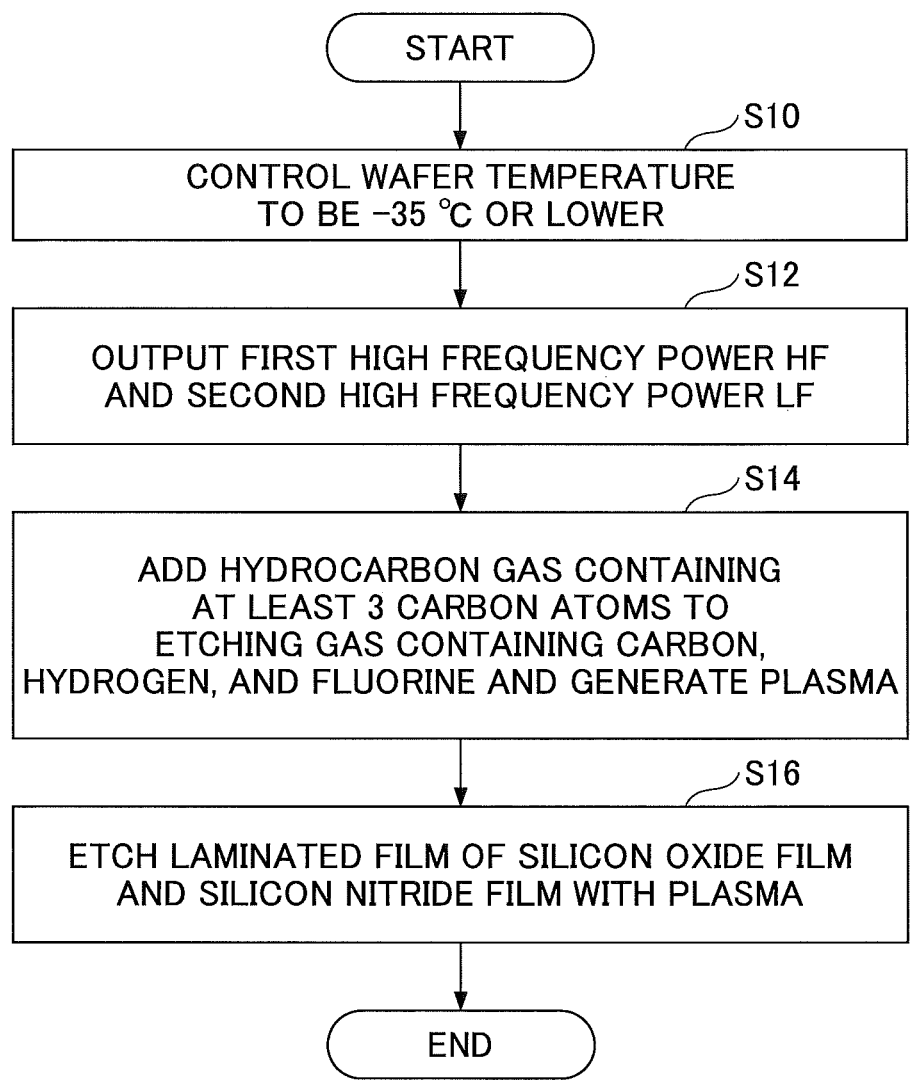
FIG. 4 is a flowchart showing an etching process method according to a first embodiment of the present invention.

In the following, an etching process method according to a first embodiment of the present invention will be described with reference to FIG. 4. FIG. 4 is a flowchart showing an example etching process method according to the first embodiment.

When the process of FIG. 4 is started, first, the control unit 100 controls the temperature of the refrigerant (brine) output from the chiller 107 to be −60° C. to −70° C., for example, so that the temperature of the wafer W can be controlled to be less than or equal to −35° C. (step S10). Then, the control unit 100 controls the first high frequency power supply 32 to output the first high frequency power HF and controls the second high frequency power supply 34 to output the second high frequency power LF (step S12).

Then, the control unit 100 controls gas supply such that a hydrocarbon gas containing at least 3 carbon atoms is added to an etching gas containing carbon, hydrogen and fluorine (step S14). In this way, a plasma is generated from the supplied gas. Then, the control unit 100 causes the laminated film 12 to be etched by the action of the plasma (step S16) and ends the present process.

Figure 5:
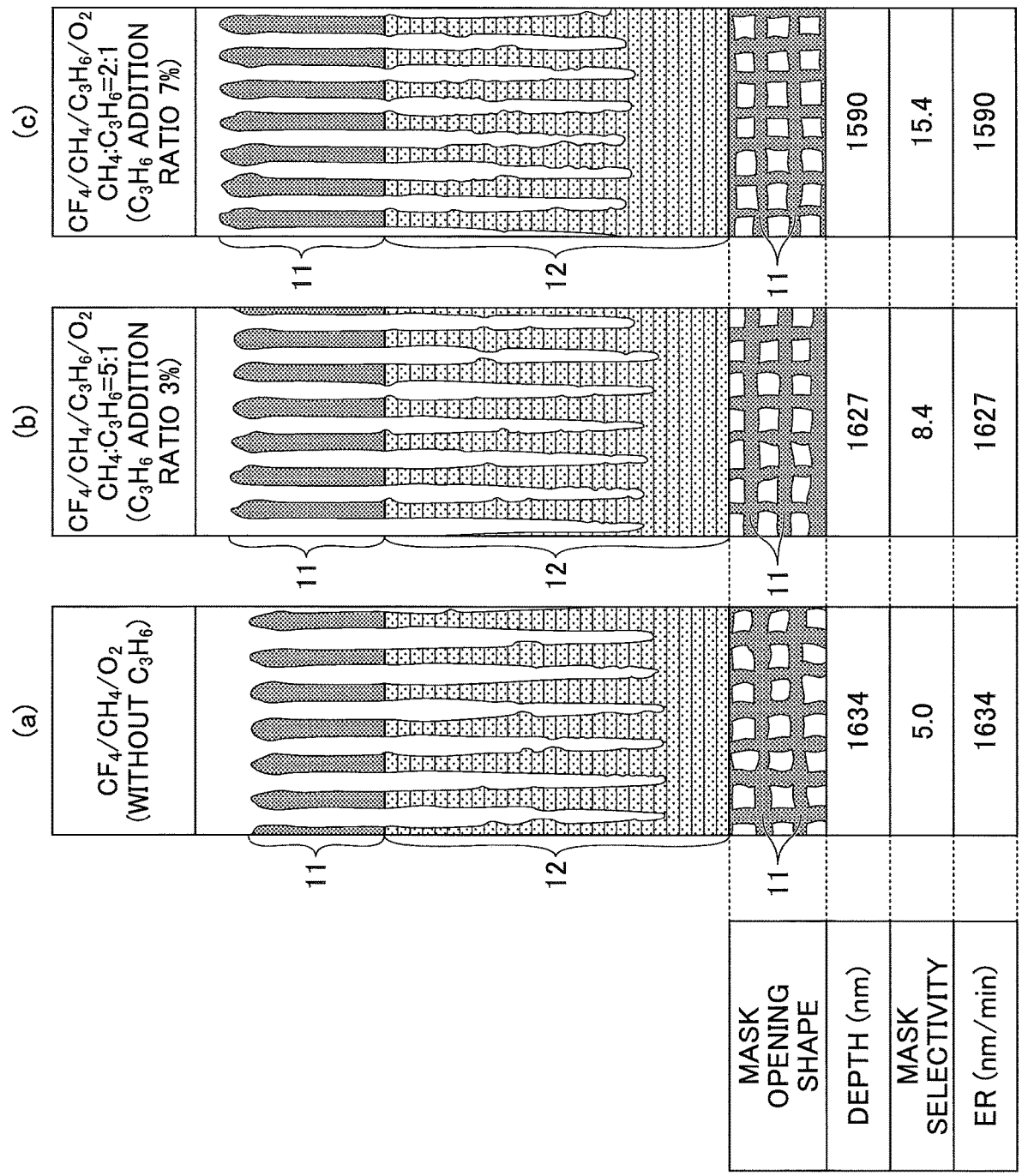
FIG. 5 is a diagram showing example results of implementing the etching process method according to the first embodiment.

FIG. 5 is a diagram showing example results of executing the etching process method according to the first embodiment under the following process conditions. In the present example, $CF_4/CH_4/O_2$ gas was supplied as the etching gas containing carbon, hydrogen and fluorine. Further, $C_3H_6$ (propylene) gas was added as a hydrocarbon gas containing at least 3 carbon atoms to the etching gas.

Process Conditions

| Wafer Temperature | −40° C. or lower |
|---|---|
| Gas | $CF_4/CH_4/O_2$ (with/without $C_3H_6$ gas) |
| First High Frequency Power HF | 2500 W, continuous wave |
| Second High Frequency Power LF | 6000 W, continuous wave |

In FIG. 5, (a) represents an etching result in a case where no $C_3H_6$ gas was added to the $CF_4/CH_4/O_2$ gas, and (b) and (c) represent etching results in cases where $C_3H_6$ gas was added to the $CF_4/CH_4/O_2$ gas. In (b) of FIG. 5, the partial pressure ratio (flow rate ratio) of $CH_4$ gas to $C_3H_6$ gas was controlled to be 5:1, and the addition ratio of $C_3H_6$ gas with respect to the total flow rate of gas was controlled to be 3%. In (c) of FIG. 5, the partial pressure ratio (flow rate ratio) of $CH_4$ gas to $C_3H_6$ gas was controlled to be 2:1, and the addition ratio of $C_3H_6$ gas with respect to the total flow rate of gas was controlled to be 7%.

As can be appreciated from these etching results, when $C_3H_6$ gas is added at an addition ratio of 3% as shown in FIG. 5 (b) or when $C_3H_6$ gas is added at an addition ratio of 7% as shown in FIG. 5 (c), the remainder of the organic film 11 increases and the mask selectivity increases as compared with the case where no $C_3H_6$ gas is added as shown in FIG. 5 (a). Also, roughening of the surface of the organic film 11 can be suppressed and the shapes of the openings in the organic film 11 can be desirably maintained while maintaining the etching depth and the etch rate (ER) substantially the same as the case where no $C_3H_6$ gas is added. In this way, holes having desirable etching profiles may be formed in the laminated film 12.

As described above, in the etching process method according to the first embodiment, a hydrocarbon gas containing at least 3 carbon atoms is added to an etching gas containing carbon, hydrogen, and fluorine. In this way, the mask selectivity in etching the laminated film 12 can be increased. Also, clogging of the openings in the organic film 11 can be suppressed, and a desirable etching profile can be obtained.

Note that the flow rate of $C_3H_6$ gas added to the gas mixture of $CF_4$ gas, $CH_4$ gas, and $O_2$ gas is preferably controlled to be less than or equal to 10% of the total flow rate of gas. When $C_3H_6$ gas is added to the gas mixture at a flow rate exceeding 10% of the total flow rate of gas, the openings in the organic film 11 that is used as a mask become more susceptible to clogging or may be completely clogged, and a desirable etching profile may not be obtained.

[Etching at Cryogenic Temperature: Second Embodiment]

Figure 6:
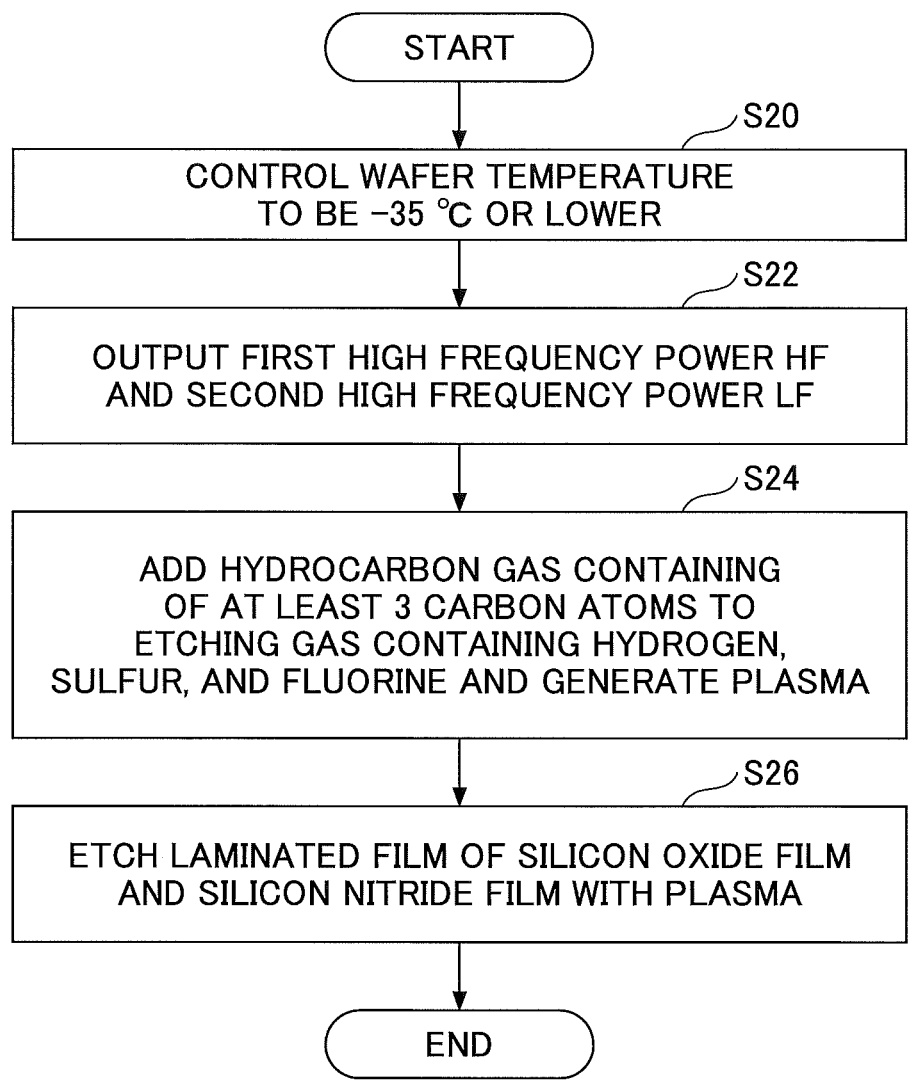
FIG. 6 is a flowchart showing another etching process method according to a second embodiment of the present invention.

In the following, an etching process method according to a second embodiment of the present invention will be described with reference to FIG. 6. FIG. 6 is a flowchart showing an example etching process method according to the second embodiment.

When the process of FIG. 6 is started, first, the control unit 100 controls the temperature of the refrigerant output from the chiller 107 to be −60° C. to −70° C., for example, so that the temperature of the wafer W may be controlled to be less than or equal to −35° C. (step S20). Then, the control unit 100 controls the first high frequency power supply 32 to output the first high frequency power HF and the second high frequency power supply 34 to output the second high-frequency power LF (step S22).

Then, the control unit 100 controls gas supply such that a hydrocarbon gas containing at least 3 carbon atoms is added to an etching gas containing hydrogen, sulfur, and fluorine (step S24). In this way, a plasma is generated from the supplied gas. Then, the control unit 100 controls etching of the laminated film 12 by the action of plasma (step S26) and ends the present process.

Figure 7:
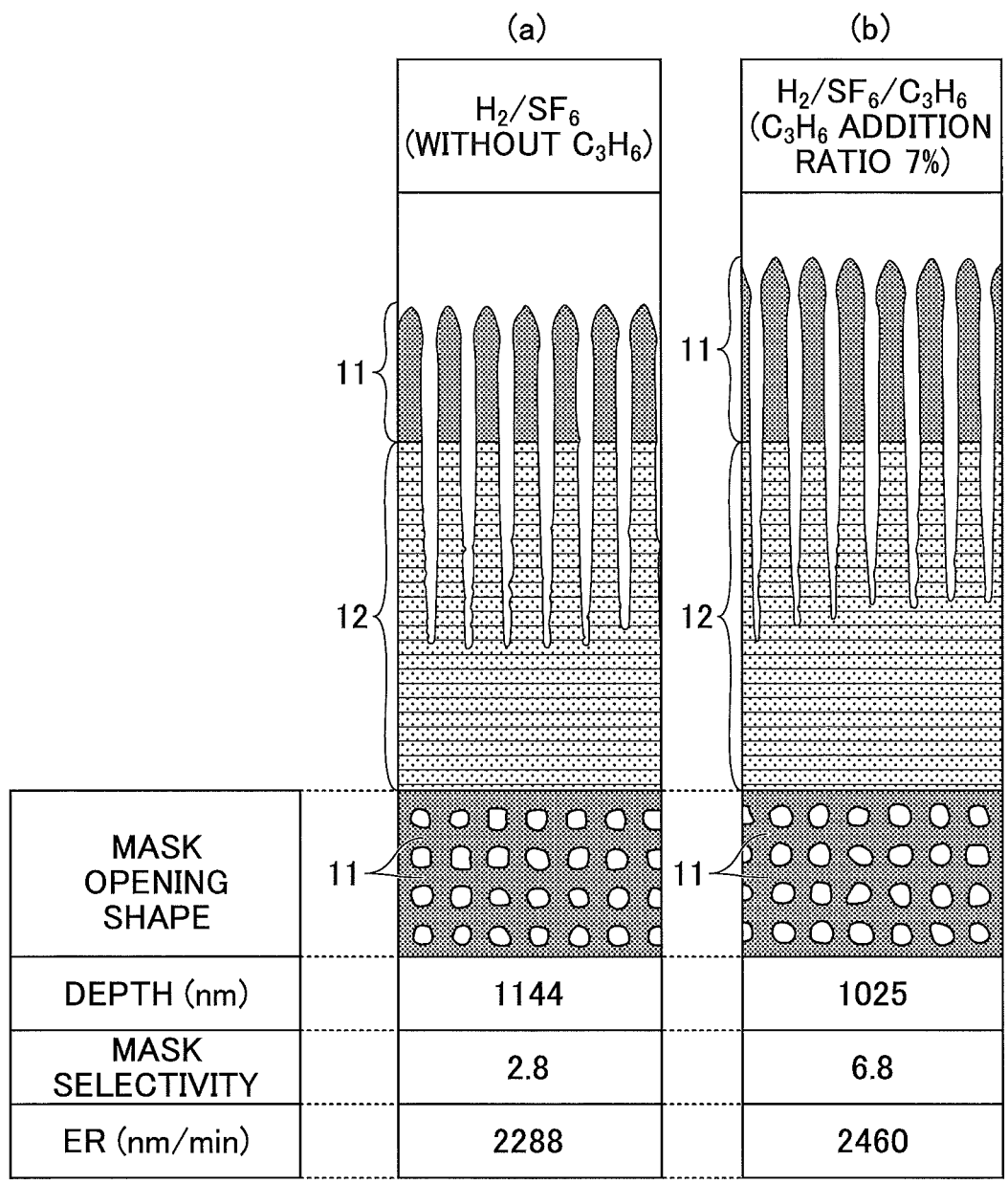
FIG. 7 is a diagram showing example results of implementing the etching process method according to the second embodiment.

FIG. 7 is a diagram showing example results of executing the etching process method according to the second embodiment under the following process conditions. In the present example, a gas mixture of $SF_6$ gas and $H_2$ gas was supplied as an etching gas containing hydrogen, sulfur and fluorine. Also, $C_3H_6$ gas was added as a hydrocarbon gas containing at least 3 atoms to the etching gas.

Process Conditions

| | |
|---|---|
| Wafer Temperature | −40° C. or lower |
| Gas | $SF_6/H_2$ (with/without $C_3H_6$ gas) |
| First High Frequency Power HF | 2500 W, continuous wave |
| Second High Frequency Power LF | 6000 W, continuous wave |

In FIG. 7, (a) shows an etching result in a case where no $C_3H_6$ gas was added to the $SF_6/H_2$ gas, and (b) shows an etching result in a case where $C_3H_6$ gas was added to the $SF_6/H_2$ gas. In (b) of FIG. 7, the addition ratio of $C_3H_6$ gas with respect to the total flow rate of gas was controlled to be 7%.

As can be appreciated from these etching results, when $C_3H_6$ gas is added at an addition ratio of 7% as shown in FIG. 7 (b), the remainder of the organic film 11 increases and the mask selectivity increases as compared with the case where no $C_3H_6$ gas is added as shown in FIG. 7 (a). Further, roughening of the surface of the organic film 11 can be suppressed and the shapes of the openings in the organic film 11 can be desirably maintained while maintaining the etching depth and the etch rate (ER) substantially the same as the case where no $C_3H_6$ gas is added. In this way, holes having desirable etching profiles can be formed in the laminated film 12.

As described above, in the etching process method according to the second embodiment, a hydrocarbon gas containing at least 3 carbon atoms is added to an etching gas containing hydrogen, sulfur, and fluorine. In this way, the mask selectivity when etching the laminated film 12 may be increased. Also, clogging of the openings in the organic film 11 can be avoided, and a desirable etching profile can be obtained.

Note that the flow rate of $C_3H_6$ gas added to the $SF_6/H_2$ gas is preferably controlled to be less than or equal to 10% of the total flow rate of gas. When the $C_3H_6$ gas is added to the $SF_6/H_2$ gas at a flow rate exceeding 10% of the total flow rate of gas, the openings in the organic film 11 that is used as a mask may become more susceptible to clogging or may be completely clogged, and a desirable etching profile may not be obtained, for example.

Although an etching process method according to the present invention has been described above with reference to illustrative embodiments, the etching process method according to the present invention is not limited to the above embodiments and various modifications and changes can be made within the scope of the present invention.

For example, the hydrocarbon gas added to the etching gas containing hydrogen, sulfur, and fluorine is not limited to the hydrocarbon gas described above, but may be any hydrocarbon gas containing one double bond between carbon atoms. Similarly, the hydrocarbon gas to be added to the etching gas containing carbon, hydrogen, and fluorine is not limited to the hydrocarbon gas described above but may be any hydrocarbon gas containing one double bond between carbon atoms. Hydrocarbon gases that may be added to the etching gas include $C_3H_6$ (propylene) gas and $C_4H_8$ (butene) gas, for example.

Also, the etching target film is not limited to the laminated film 12 made up of $SiO_2$ and SiN, but may be a single layer film made of only $SiO_2$, for example. Also, the laminated film 12 made up of $SiO_2$ and SiN is merely one example of a laminated film made up of silicon-containing films having different compositions. That is, other types of laminated films, such as a laminated film made of polysilicon and $SiO_2$ may be used as an etching target film in embodiments of the present invention.

Also, the etching process method according to the present invention is not limited to being implemented in a capacitively coupled plasma (CCP) apparatus as illustrated in FIG. 1 but may also be implemented in other types of plasma processing apparatuses, such as an inductively coupled plasma (ICP) processing apparatus, a plasma processing apparatus using a radial line slot antenna, a helicon wave plasma (HWP) apparatus, or an electron cyclotron resonance plasma (ECR) apparatus, for example.

Also, although the semiconductor wafer W is described as an example substrate to be processed, various other types of substrates, such as a substrate used in an LCD (Liquid Crystal Display) or a FPD (Flat Panel Display), a photomask, a CD substrate, or a printed circuit board, may be subjected to the etching process method according to the present invention.

Further, note that the etching process method according to an embodiment of the present invention may be advantageously implemented in an etching process for forming a deep hole or a deep trench in a laminated film made up of laminated layers of silicon-containing films having different compositions using a plasma to fabricate a three-dimensional (3D) stacked semiconductor memory, such as a 3D NAND flash memory, having an aspect ratio of at least 20, for example. In such an etching process, a hole or a trench may be formed to penetrate through 16 layers or 32 layers of films making up the laminated film to reach an underlying film, for example, and as such, by implementing the etching process method according to an embodiment of the present invention, the hole or trench may be desirably formed, for example.

What is claimed is:

1. An etching process method comprising:
   outputting a first high frequency power of a first frequency from a first high frequency power supply, and outputting a second high frequency power of a second frequency, which is lower than the first high frequency, from a second high frequency power supply in an environment where a substrate temperature is controlled to be less than or equal to −35° C.;
   adding a hydrocarbon gas containing at least 3 carbon atoms to an etching gas containing carbon, hydrogen, and fluorine for generating a plasma; and
   etching a silicon oxide film or a laminated film made up of laminated layers of silicon-containing films having different compositions using generated plasma,
   wherein the hydrocarbon gas contains one double bond between carbon atoms, and
   wherein the hydrocarbon gas is butene.

2. The etching process method according to claim 1, wherein an addition ratio of the hydrocarbon gas is controlled to be less than or equal to 10% of a total flow rate of the etching gas and the hydrocarbon gas.

3. The etching process method according to claim 1, wherein a partial pressure ratio of the etching gas and the hydrocarbon gas is 2:1, and an addition ratio of the hydrocarbon gas is controlled to be 7% of a total flow rate of the etching gas and the hydrocarbon gas.

4. The etching process method according to claim 1, further comprising controlling a temperature of a chiller that is configured to cool a mounting table for mounting the substrate from −60° C. to −70° C.

5. An etching process method comprising:
   outputting a first high frequency power of a first frequency from a first high frequency power supply, and outputting a second high frequency power of a second frequency, which is lower than the first high frequency, from a second high frequency power supply in an environment where a substrate temperature is controlled to be less than or equal to −35° C.;
   adding a hydrocarbon gas containing at least 3 carbon atoms to an etching gas containing hydrogen, sulfur, and fluorine for generating a plasma; and
   etching a silicon oxide film or a laminated film made up of laminated layers of silicon-containing films having different compositions using generated plasma,
   wherein the hydrocarbon gas contains one double bond between carbon atoms.

6. The etching process method according to claim 5, wherein the hydrocarbon gas is propylene.

7. The etching process method according to claim 5, wherein an addition ratio of the hydrocarbon gas is controlled to be less than or equal to 10% of a total flow rate of the etching gas and the hydrocarbon gas.

* * * * *